United States Patent
Chang et al.

(10) Patent No.: US 11,239,338 B2
(45) Date of Patent: Feb. 1, 2022

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Chun-Ming Chang, Kaohsiung (TW); Che-Hung Huang, Hsinchu (TW); Wen-Jung Liao, Hsinchu (TW); Chun-Liang Hou, Hsinchu County (TW); Chih-Tung Yeh, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/666,430

(22) Filed: Oct. 29, 2019

(65) Prior Publication Data
US 2021/0098601 A1  Apr. 1, 2021

(30) Foreign Application Priority Data
Oct. 1, 2019 (TW) .................. 108135419

(51) Int. Cl.
| | | |
|---|---|---|
| H01L 29/66 | (2006.01) |
| H01L 29/778 | (2006.01) |
| H01L 21/308 | (2006.01) |
| H01L 29/205 | (2006.01) |
| H01L 29/20 | (2006.01) |

(52) U.S. Cl.
CPC .... *H01L 29/66462* (2013.01); *H01L 21/3081* (2013.01); *H01L 29/7787* (2013.01); *H01L 29/2003* (2013.01); *H01L 29/205* (2013.01)

(58) Field of Classification Search
None
See application file for complete search history.

(56) References Cited

U.S. PATENT DOCUMENTS

| | | | |
|---|---|---|---|
| 9,379,191 B2 | 6/2016 | Hsu et al. | |
| 2004/0135169 A1* | 7/2004 | Yoshii | H01L 29/1029 257/107 |
| 2009/0057720 A1* | 3/2009 | Kaneko | H01L 29/432 257/194 |
| 2010/0155720 A1* | 6/2010 | Kaneko | H01L 29/7786 257/43 |
| 2014/0017885 A1* | 1/2014 | Yoon | H01L 29/66863 438/586 |
| 2014/0091309 A1* | 4/2014 | Hallin | H01L 29/66462 257/76 |
| 2015/0137184 A1* | 5/2015 | Yamada | H01L 29/2003 257/194 |

* cited by examiner

*Primary Examiner* — Daniel Whalen
(74) *Attorney, Agent, or Firm* — Winston Hsu

(57) ABSTRACT

According to an embodiment of the present invention, a method for fabricating high electron mobility transistor (HEMT) includes the steps of: forming a buffer layer on a substrate; forming a first barrier layer on the buffer layer; forming a second barrier layer on the first barrier layer; forming a first hard mask on the second barrier layer; removing the first hard mask and the second barrier layer to form a recess; and forming a p-type semiconductor layer in the recess.

8 Claims, 3 Drawing Sheets

US 11,239,338 B2

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a buffer layer on a substrate; forming a first barrier layer on the buffer layer; forming a second barrier layer on the first barrier layer; forming a first hard mask on the second barrier layer; removing the first hard mask and the second barrier layer to form a recess; and forming a p-type semiconductor layer in the recess.

According to another aspect of the present invention, a high electron mobility transistor (HEMT) includes: a buffer layer on a substrate; a first barrier layer on the buffer layer; a p-type semiconductor layer on the first barrier layer; a second barrier layer adjacent to two sides of the p-type semiconductor layer and on the first barrier layer; a gate electrode on the p-type semiconductor layer; and a source electrode and a drain electrode adjacent to two sides of the gate electrode on the buffer layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
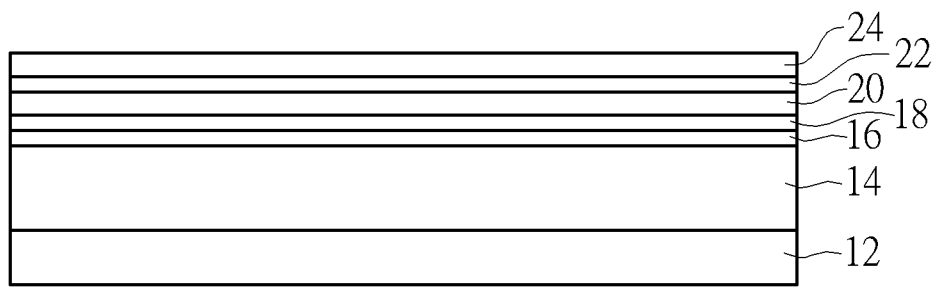
FIGS. 1-5 illustrate a method for fabricating a HEMT according to an embodiment of the present invention.

Referring to the FIGS. 1-5, FIGS. 1-5 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a selective metal nitride layer 16 could be formed on the surface of the buffer layer serving as a gate dielectric layer. According to an embodiment of the present invention, the metal nitride layer 16 could include aluminum nitride (AlN) and the formation of the metal nitride layer 16 could be accomplished by a metal organic chemical vapor deposition (MOCVD) process, a chemical vapor deposition (CVD) process, a hydride vapor phase epitaxy (HVPE) process, or combination thereof.

Next, a first barrier layer 18 and a second barrier layer 20 are formed on the surface of the metal nitride layer 16. In this embodiment, the first barrier layer 18 and the second barrier layer 20 are both made of III-V semiconductor such as aluminum gallium nitride ($Al_xGa_{1-x}N$) and each of the first barrier layer 18 and the second barrier layer 20 preferably includes an epitaxial layer formed through epitaxial growth process. In this embodiment, the first barrier layer 18 and the second barrier layer 20 preferably include different thicknesses such as the thickness of the first barrier layer 18 is less than the thickness of the first second layer 20. Moreover, the first barrier layer 18 and the second barrier layer 20 preferably includes different concentrations of aluminum or more specifically the aluminum concentration of the first barrier layer 18 is less than the aluminum concentration of the second barrier layer 20. For instance, the first barrier layer 18 is made of III-V semiconductor such as aluminum gallium nitride ($Al_xGa_{1-x}N$), in which $0<x<1$, x being 5-15% and the second barrier layer 20 is made of III-V semiconductor such as aluminum gallium nitride ($Al_xGa_{1-x}N$), in which $0<x<1$, x being 15-50%.

Similar to the buffer layer 14, the formation of the first barrier layer 18 and second barrier layer 20 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a first hard mask 22 and a second hard mask 24 are sequentially formed on the surface of the second barrier layer 20. In this embodiment, the first hard mask 22 and the second hard mask 24 are preferably made of different materials, in which the first hard mask 22 preferably includes silicon nitride having a thickness less than 5 nm and the second hard mask 24 preferably includes silicon oxide, but not limited thereto.

Figure 2:
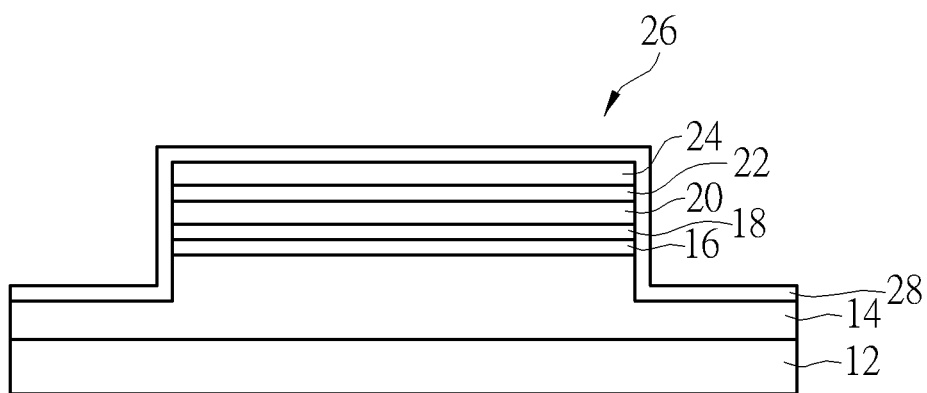

Next, as shown in FIG. 2, a MESA isolation process is conducted to define a MESA area 26 and an active area so that devices could be isolated to operate independently without affecting each other. In this embodiment, the MESA isolation process could be accomplished by conducting a photo-etching process to remove part of the second hard mask 24, part of the first hard mask 22, part of the second barrier layer 20, part of the first barrier layer 18, part of the metal nitride layer 16, and part of the buffer layer 14, in which the patterned second hard mask 24, the patterned first hard mask 22, the patterned second barrier layer 20, the patterned first barrier layer 18, the patterned metal nitride layer 16, and the patterned buffer layer 14 preferably share equal widths and edges of the patterned materials layers are aligned. The width of the remaining un-patterned buffer layer 14 is preferably equal to the width of the substrate 12.

Next, a third hard mask 28 is formed on the second hard mask 24 to cover top surface and sidewalls of the patterned second hard mask 24, sidewalls of the first hard mask 22, sidewalls of the second barrier layer 20, sidewalls of the first barrier layer 18, sidewalls of the metal nitride layer 16, sidewalls of the buffer layer 14, and surface of the buffer layer 14 adjacent to two sides of the MESA area 26. In this embodiment, the second hard mask 24 and the third hard mask 28 are preferably made of same material such as silicon oxide, but not limited thereto.

Figure 3:
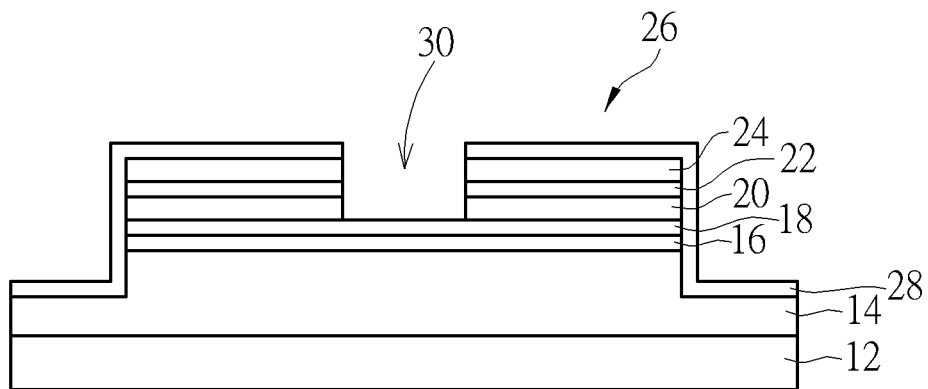

Next, as shown in FIG. 3, a photo-etching process is conducted by using a patterned mask (not shown) as mask to remove part of the third hard mask 28, part of the second hard mask 24, part of the first hard mask 22, and part of the second barrier layer 20 to form a recess 30 exposing the surface of the first barrier layer 18. It should be noted that, even though none of the first barrier layer 18 is removed during the photo-etching process or the top surface of the first barrier layer 18 directly under the recess 30 is even with the top surface of the first barrier layer 18 adjacent to two sides of the recess 30 after the photo-etching process, according to another embodiment of the present invention, it would also be desirable to remove part of the second barrier layer 20 and then remove a little portion of the first barrier layer 18 to form the recess 30 so that the top surface of the remaining first barrier layer 18 directly under the recess 30 is slightly lower than the top surface of the first barrier layer 18 adjacent to two sides of the recess 30, which is also within the scope of the present invention.

Figure 4:
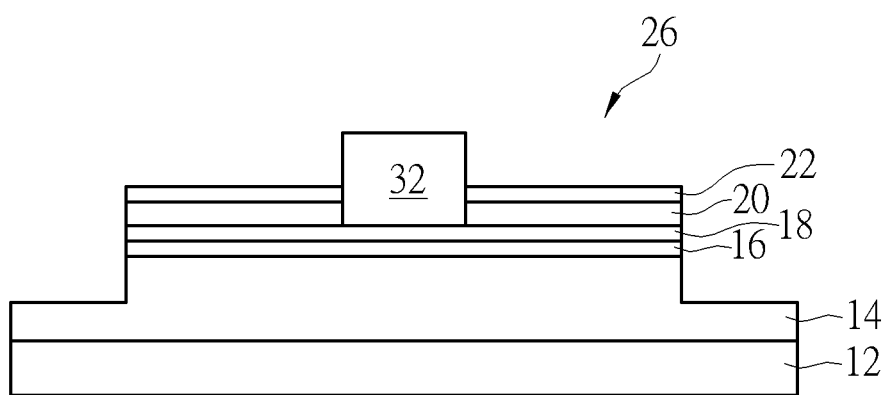

Next, as shown in FIG. 4, a p-type semiconductor layer 32 is formed on the first barrier layer 18 directly under the recess 30, and the third hard mask 28 and second hard mask 24 are removed to expose the first hard mask 22 underneath. In this embodiment, the p-type semiconductor layer 32 is a III-V compound semiconductor layer preferably including p-type GaN (pGaN) and the formation of the p-type semiconductor layer 32 on the first barrier layer 18 within the recess 30 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. After the p-type semiconductor layer 32 is formed, the top surface of the p-type semiconductor layer 32 is preferably higher than the top surface of the first hard mask 22 on adjacent two sides.

Figure 5:
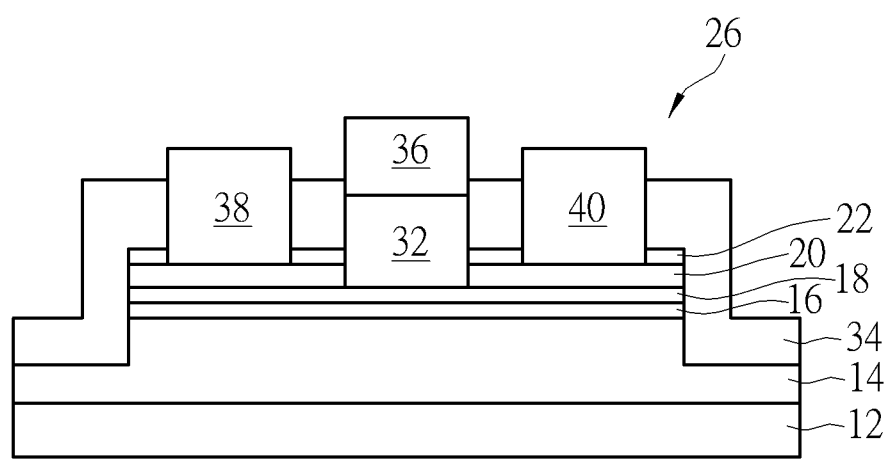

Next, as shown in FIG. 5, a passivation layer 34 is formed on the first has mask 22, the p-type semiconductor layer 32, and surface of the buffer layer 14 adjacent to two sides of the MESA area 26, a gate electrode 36 is formed on the p-type semiconductor layer 32, and a source electrode 38 and drain electrode 40 are formed adjacent to two sides of the gate electrode 36. In this embodiment, the formation of the gate electrode 36, the source electrode 38, and the drain electrode 40 could be accomplished by first conducting a photo-etching process to remove part of the passivation layer 34 directly on top of the p-type semiconductor layer 32 to form a recess (not shown), forming the gate electrode 36 in the recess, removing part of the passivation layer 34 and part of the first hard mask 22 adjacent to two sides of the gate electrode 36 to form two recesses (not shown), and then forming the source electrode 38 and drain electrode 40 in the two recesses.

In this embodiment, the gate electrode 36, the source electrode 38, and the drain electrode 40 are preferably made of metal, in which the gate electrode 36 is preferably made of Schottky metal while the source electrode 38 and the drain electrode 40 are preferably made of ohmic contact metals. According to an embodiment of the present invention, each of the gate electrode 36, source electrode 38, and drain electrode 40 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned recesses, and then pattern the electrode materials through one or more etching processes to form the gate electrode 36, source electrode 38, and the drain electrode 40. This completes the fabrication of a HEMT according to an embodiment of the present invention.

Referring again to FIG. 5, FIG. 5 further illustrates a structural view of a HEMT according to an embodiment of the present invention. As shown in FIG. 5, the HMET includes a buffer layer 14 disposed on a substrate 12, a p-type semiconductor layer 32 disposed on the buffer layer 14, a first barrier layer 18 disposed between the buffer layer 14 and the p-type semiconductor layer 32, a second barrier layer 20 disposed on the first barrier layer 18 adjacent to two sides of the p-type semiconductor layer 32, a gate electrode 36 disposed on the p-type semiconductor layer 32, and a source electrode 38 and drain electrode 40 disposed on the second barrier layer 20 adjacent to two sides of the gate electrode 36, in which the sidewalls of the p-type semiconductor layer 32 and gate electrode 36 are aligned.

In this embodiment, the first barrier layer 18 and the second barrier layer 20 preferably include different thicknesses such as the thickness of the first barrier layer 18 is less than the thickness of the second barrier layer 20. Moreover, the first barrier layer 18 and the second barrier layer 20 preferably includes different concentrations of aluminum or more specifically the aluminum concentration of the first barrier layer 18 is less than the aluminum concentration of the second barrier layer 20. For instance, the first barrier layer 18 is made of III-V semiconductor such as aluminum gallium nitride ($Al_xGa_{1-x}N$), in which 0<x<1, x being 5-15% and the second barrier layer 20 is made of III-V semiconductor such as aluminum gallium nitride ($Al_xGa_{1-x}N$), in which 0<x<1, x being 15-50%. The p-type semiconductor layer 28 preferably includes p-type GaN.

Overall, the present invention first forms multiple hard masks made of dielectric material including but not limited to for example silicon nitride and/or silicon oxide on the surface of AlGaN barrier layer, removes part of the hard masks and part of the AlGaN barrier layer to form a recess, and then forms a p-type semiconductor layer and gate electrode in the recess. By employing this approach the hard masks formed on the surface of the AlGaN barrier layer could be used to protect the AlGaN barrier layer from damages caused by various etchant during the fabrication process and also prevent issue such as stress degradation occurring after the formation of passivation layer.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A high electron mobility transistor (HEMT), comprising:
    a buffer layer on a substrate;
    a first barrier layer on the buffer layer;
    a p-type semiconductor layer on the first barrier layer, wherein the p-type semiconductor layer comprises a rectangular shape in a cross-section view;
    a second barrier layer adjacent to two sides of the p-type semiconductor layer and on the first barrier layer, wherein the p-type semiconductor layer contacts the second barrier layer directly, the first barrier layer and the second barrier layer comprise III-V semiconductor, bottom surfaces of the second barrier layer and the p-type semiconductor layer are coplanar, and a top surface of the second barrier layer is lower than a top surface of the p-type semiconductor layer;
    a hard mask on the second barrier layer and the p-type semiconductor layer;
    a passivation layer on and directly contacting a top surface of the hard mask and sidewalls of the second barrier layer, the first barrier layer, and the buffer layer;
    a gate electrode on the p-type semiconductor layer, wherein a sidewall of the p-type semiconductor layer is aligned to a sidewall of the gate electrode and orthogonal to a top surface of the substrate; and
    a source electrode and a drain electrode adjacent to two sides of the gate electrode on the buffer layer.

2. The HEMT of claim 1, wherein a top surface of the hard mask is lower than the top surface of the p-type semiconductor layer.

3. The HEMT of claim 1, wherein the first barrier layer and the second barrier layer comprise $Al_xGa_{1-x}N$.

4. The HEMT of claim 3, wherein the first barrier layer and the second barrier layer comprise different concentrations of Al.

5. The HEMT of claim 3, wherein a concentration of Al of the first barrier layer is less than a concentration of Al of the second barrier layer.

6. The HEMT of claim 1, wherein a thickness of the first barrier layer is less than a thickness of the second barrier layer.

7. The HEMT of claim 1, further comprising a metal nitride layer between the buffer layer and the first barrier layer.

8. The HEMT of claim 1, wherein the p-type semiconductor layer comprises p-type gallium nitride (pGaN).

* * * * *